(12) United States Patent
Pinon (10) Patent No.: US 11,196,419 B2
(45) Date of Patent: Dec. 7, 2021

(54) INTEGRATED VOLTAGE LEVEL SHIFTER DEVICE

(71) Applicant: STMicroelectronics (Grenoble 2) SAS, Grenoble (FR)

(72) Inventor: Vincent Pinon, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/870,276

(22) Filed: May 8, 2020

(65) Prior Publication Data

US 2020/0366293 A1     Nov. 19, 2020

(30) Foreign Application Priority Data

May 14, 2019   (FR) ...................... 1905024

(51) Int. Cl.
*H03K 19/0175*   (2006.01)
*H03K 19/0185*   (2006.01)
*H03K 3/356*     (2006.01)
*H03K 19/003*    (2006.01)

(52) U.S. Cl.
CPC ............ *H03K 19/018521* (2013.01); *H03K 3/356113* (2013.01); *H03K 3/356182* (2013.01); *H03K 19/00384* (2013.01); *H03K 19/0175* (2013.01); *H03K 19/0185* (2013.01); *H03K 19/017509* (2013.01)

(58) Field of Classification Search
CPC ....... H03K 19/0175; H03K 19/017509; H03K 19/017527; H03K 19/0185; H03K 19/018507; H03K 19/018514; H03K 19/018521; H03K 19/018528; H03K 3/356113; H03K 19/356182; H03K 19/00384

See application file for complete search history.

(56) References Cited

U.S. PATENT DOCUMENTS 6,388,498 B1 * 5/2002 Moriwaki ............ H01L 27/092
                                            257/E27.062
6,445,210 B2 * 9/2002 Nojiri ............ H03K 19/018528
                                            326/68
7,348,801 B2 * 3/2008 Nojiri .................... H03K 3/012
                                            326/68

(Continued)

FOREIGN PATENT DOCUMENTS

WO         0139373 A1     5/2001

*Primary Examiner* — Long Nguyen
(74) *Attorney, Agent, or Firm* — Slater Matsil, LLP (57) ABSTRACT

A voltage level shifter device an input stage and an output stage. The input stage is configured to lower one of the first and second output terminals to the low level according to the level of the input voltage. A latch circuit includes a first branch having a first PMOS transistor and a second PMOS transistor coupled in series coupled between a shifted-high-level voltage supply terminal and the first output terminal and a second branch having a third PMOS transistor an a fourth PMOS transistor coupled in series between the shifted-high-level voltage supply terminal and the second output terminal. The first output terminal is a gate of the second PMOS transistor and to a gate of the third PMOS transistor. The second output terminal is coupled a gate of the fourth PMOS transistor and to a gate of the first PMOS transistor.

21 Claims, 7 Drawing Sheets

(56) References Cited

U.S. PATENT DOCUMENTS

| | | | |
|---|---|---|---|
| 7,436,213 B2 * | 10/2008 | Nojiri | H03K 3/012 |
| | | | 326/68 |
| 7,679,421 B1 * | 3/2010 | Hsu | H03K 3/356113 |
| | | | 327/333 |
| 7,884,646 B1 | 2/2011 | Bourstein | |
| 2006/0208759 A1 | 9/2006 | Nojiri | |
| 2010/0201425 A1 | 8/2010 | Ku | |
| 2013/0162294 A1 | 6/2013 | Henmi et al. | |
| 2017/0085265 A1 | 3/2017 | Roham et al. | |

* cited by examiner

INTEGRATED VOLTAGE LEVEL SHIFTER DEVICE

CROSS-REFERENCE TO RELATED APPLICATIONS

This application claims priority to French Patent Application No. 1905024, filed on May 14, 2019, which application is hereby incorporated herein by reference.

TECHNICAL FIELD

Embodiments relate to integrated circuits, in particular to voltage level shifter devices.

BACKGROUND

Voltage level shifter devices make it possible to generate a high-level voltage, for example 3 V or 5 V, potentially intended for an analog portion of an integrated circuit, from a command at a lower-level voltage, for example 1V, potentially being transmitted by a digital portion of the integrated circuit.

Figure 1:
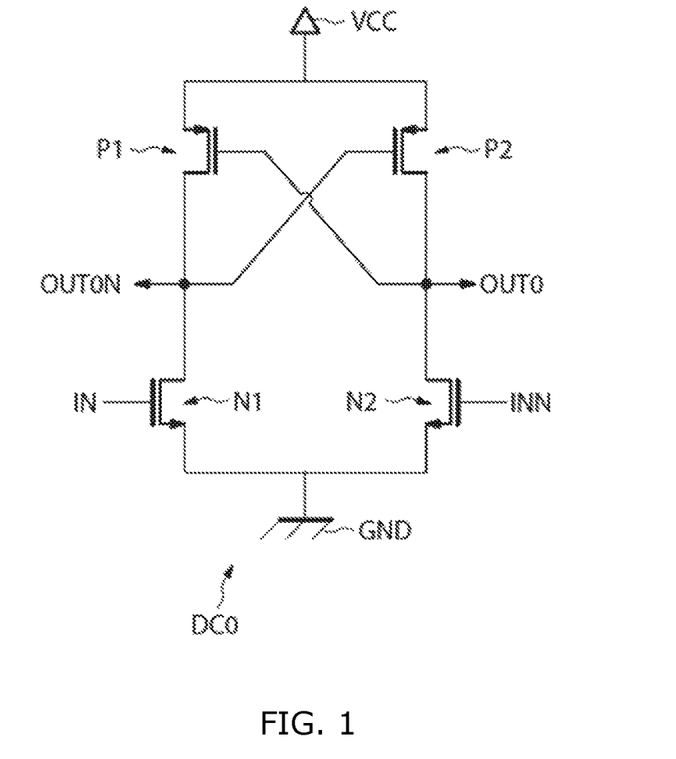
FIG. 1 illustrates a conventional voltage level shifter.

FIG. 1 shows a conventional voltage level shifter including a latch for keeping an output OUTo at a level that is shifted positively with respect to the level of the voltage that controls the input IN.

The latch includes two PMOS transistors, P1 and P2, that are cross-coupled, the gate of one being coupled with the drain of the other. The cross-coupled transistors are further coupled by their sources to a high-level power supply VCC.

Two complementary outputs OUTo, OUToN of the latch are thus formed at the drains of the cross-coupled transistors. This configuration allows the state in which the latch is placed to be held in the memory and the voltage of the outputs OUTo, OUToN to be brought up to VCC according to the state of the latch.

An input stage including two NMOS transistors N1 and N2, which are coupled in series between a low-level power supply GND and each of the outputs OUTo, OUToN, allows the latch to be placed in a state controlled by the input IN. The transistor N1 is controlled over its gate via the input IN while the transistor N2 is controlled over its gate via the inverted input signal INN.

Thus, when one of the NMOS transistors of the input stage is controlled so as to be on, it forces the corresponding output to GND; the latch transmits VCC to the other output and remains in this state.

However, on each transition of the latch, the NMOS and PMOS transistors that are coupled to the same output are on at the same time, and come into conflict, each allowing current to flow so as to control the polarity of the common output, the PMOS tending to maintain the state of the latch while the NMOS aims to invert this state.

Thus, the NMOS transistors are configured to drive the output voltage more strongly towards the low level GND than the PMOS transistors drive the output voltage towards the high level VCC, even though the NMOS transistors are controlled by a voltage of lower level (for example 1V, slightly above or below the threshold of the transistors) than the high level of the latch power supply VCC (for example 3 V to 5 V), biasing the PMOS transistors with a gate-source voltage well above the threshold.

One way of obtaining this configuration of NMOS transistors is to design these transistors with a W/L size ratio (i.e. the ratio of the width W to the length L of the channel of the transistor, the properties of which are conventional and known per se) that is much higher than the W/L size ratio of the PMOS transistors of the shifter. The difference between these size ratios may reach a factor of around 100, which takes up a substantial area.

Another way is to use another type of NMOS transistor that also withstands the voltage VCC over its drain but with a lower threshold voltage. However, this type of transistor generally also requires a large area, and moreover cannot be isolated from the substrate, thereby hindering the isolation strategy on circuits that are sensitive to mixed signals.

The transistors in these conventional techniques moreover exhibit poor transconductance and substantial parasitic capacitances, thereby limiting the frequency performance of the shifter.

SUMMARY

According to embodiments, it is proposed to weaken the latch once the state has been adjusted by using PMOS transistors connected as diodes inserted into the standard latch, and by using small, high-performance transistors.

According to one aspect, a voltage level shifter device comprises an input stage that is intended to receive an input command of a voltage to be shifted that may have a high input level or a low level. A latch circuit comprises two PMOS transistors that are cross-coupled to two respective branches. Each branch includes a shifted-high-level voltage supply terminal and an output that are coupled, respectively, to the conduction terminals of the PMOS transistor of the branch. Each output is coupled to the gate of the PMOS transistor of the other branch. The input stage is configured to lower one of the two output terminals to the low level according to the level of the input command.

According to one general feature of this aspect, the latch circuit further comprises a PMOS transistor connected as a diode, in series on each branch, and the gate of which is coupled to the output of the respective branch.

For example, the latch circuit is configured to keep one output at a shifted high level, higher than the high input level, if the input command is at the high input level, the input stage being configured to lower the output to the low level if the input command is at the low level, and further comprises a PMOS transistor connected as a diode, the gate of which is coupled to the output.

The PMOS transistor connected as a diode makes it possible to limit the current that the latch circuit is able to deliver once adjusted, so as to be easily switched by the input stage. Specifically, by virtue of the PMOS transistor connected as a diode with the gate coupled to the output, before the state transition of the latch, the input stage acts on a node that is coupled to a diode, which does not interfere with the polarity of the output.

Thus, it is possible to force a new state without oversizing the input stage, the latch thus being biased so as to deliver a large current for rapid transitions, and being weakened once latched so as to switch easily with the input stage.

The input stage may comprise an inverter for inverting the level of the input command to form an inverted input command.

According to one embodiment, the input stage including at least one NMOS transistor that is coupled between a low-level-voltage supply terminal and, respectively, each output, the NMOS transistors being controlled by the input command and, respectively, by the inverted input command, inverted by an inverter, wherein the conductances of the NMOS transistors of the input stage, of the cross-coupled PMOS transistors of the latch circuit and of the PMOS transistors connected as diodes are equal to within 50%.

Thus, smaller transistors may be used in the input stage and in the latch circuit, making it possible for example to increase interactions between digital and analog portions of the integrated circuits given the gain in area, allowing the number of shifter circuits to be multiplied. Moreover, the operating speed may be increased while decreasing power consumption. Furthermore, smaller transistors allow efficient electrical isolation in integrated circuits.

According to one embodiment, the latch circuit further comprises, on each branch, a low-conductance PMOS transistor having a conductance that is less than 50% of the conductance of the NMOS transistors of the input stage, which is coupled in parallel with each PMOS transistor connected as a diode, and the gate of which is coupled with the gate of the cross-coupled PMOS transistor of the respective branch. Said PMOS transistor coupled in parallel with the PMOS transistor connected as a diode of each branch is referred to as a "low conductance" transistor only because its conductance is lower than the conductance of the NMOS transistors of the input stage.

Specifically, the level of the voltage on the outputs is lower than the value of the threshold voltage of the transistor connected as a diode. This embodiment makes it possible to deliver all of the shifted-high-level supply voltage, by shorting the transistor connected as a diode, for switching the latch, via the low-conductance transistor.

In this embodiment, the gain in space is less substantial but speed is greatly increased with respect to conventional systems, in the context of a requirement for an output voltage at a very precise level.

According to a first alternative, each PMOS transistor connected as a diode is coupled in series between the shifted-high-level voltage supply terminal and the cross-coupled PMOS transistor, on the respective branch.

According to a second alternative, each PMOS transistor connected as a diode is coupled in series between the output and the cross-coupled PMOS transistor, on the respective branch.

An integrated circuit may advantageously include a voltage level shifter device such as defined above produced such that it is incorporated within the integrated circuit.

The integrated circuit may advantageously further include a digital portion that is intended to be supplied with power at a first voltage level and an analog portion that is intended to be supplied with power at a second voltage level that is higher than the first level, the digital portion being configured to generate commands at the first voltage level for controlling the analog portion, the voltage level shifter device being configured to shift the first voltage level of the commands from the digital portion to the second voltage level for the analog portion.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF ILLUSTRATIVE EMBODIMENTS

Figure 2:
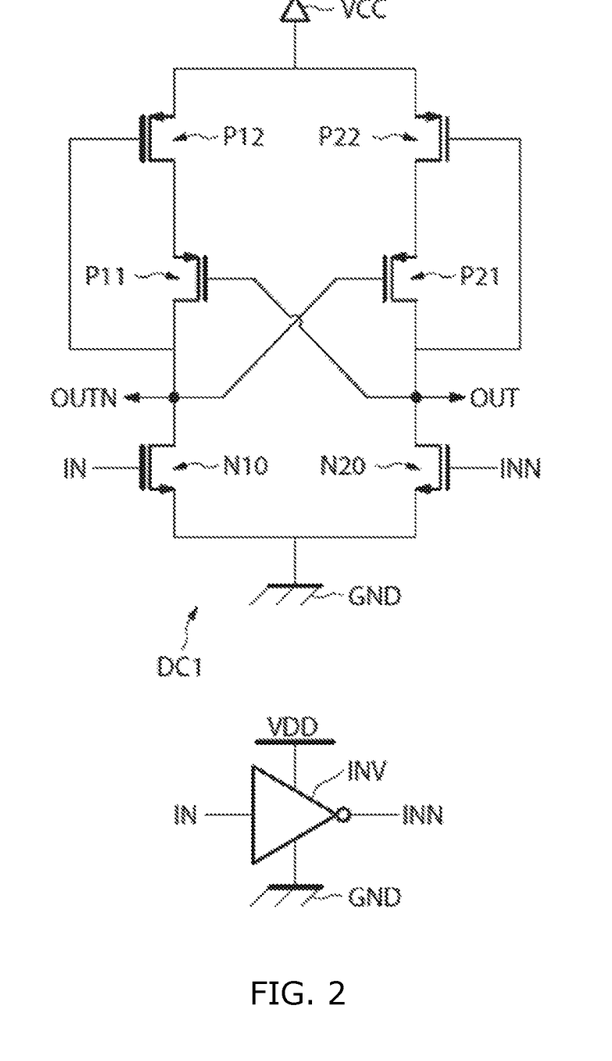
FIG. 2 shows a voltage shifter device of an embodiment.

FIG. 2 shows a voltage shifter device DC1 produced such that it is integrated within an integrated circuit.

The voltage level shifter DC1 comprises an input stage that is intended to receive an input command at a voltage that may have a high input level VDD or a low level GND. For example, the high level at input VDD is 1V and the low level is the ground GND of the circuit, or another reference voltage.

The input stage comprises a first NMOS transistor N10, a second NMOS transistor N20 and an inverter INV. The inverter is configured to invert the input signal IN to form an inverted input signal INN, with unity gain.

The first NMOS transistor N10 is coupled in series between a low-level supply terminal GND and an inverting output OUTN, while the second NMOS transistor N20 is coupled in series between the low-level supply output GND and a follower output OUT.

The first NMOS transistor is controlled by the input voltage IN and the second NMOS transistor is controlled by the inverted input voltage INN.

The input stage is thus configured to lower the follower output OUT to the low level GND if the inverted input command INN is at the high level VDD, and to lower the inverting output OUTN to the low level GND if the input command IN is at the high level VDD.

In other words, the input stage is configured to lower one of the two complementary outputs OUT, OUTN to the low level GND according to the level of the input command IN.

The voltage level shifter DC1 comprises a latch circuit comprising two cross-coupled PMOS transistors P11, P21 on two respective branches. Each branch includes a shifted-high-level voltage supply terminal VCC and an output OUT, OUTN. The two outputs are complementary, i.e. each one generates the inverse of the other. For example, the shifted-high-level voltage VCC is from 3 V to 5 V.

The supply terminal VCC and the output of each branch are coupled, respectively, to the conduction terminals of the cross-coupled PMOS transistor P11, P21 of the branch. Additionally, each cross-coupled PMOS transistor is controlled over its gate by the voltage from the output OUT, OUTN of the other branch.

The latch is thus configured to hold the follower output OUT at a shifted high level VCC that is higher than the high input level VDD if the input command IN is at the high input level, and to hold the complementary inverting output OUTN at the shifted high level VCC if the inverted input command INN is at the high input level VDD.

Furthermore, the latch circuit comprises a PMOS transistor connected as a diode P12, P22, in series on each branch, and the gate of which is coupled to the output OUT, OUTN of the respective branch.

As will be described in greater detail below, in particular with reference to FIG. 3, the PMOS transistor connected as a diode P12, P22 makes it possible to weaken the latch circuit once adjusted so as to be easily switched by the input stage.

Thus, unlike the conventional techniques, the NMOS transistors N10, N20 of the input stage and the cross-coupled PMOS transistors P11, P12 of the latch have the same "W/L" size ratio. It is recalled that the W/L size ratio is a parameter that defines, proportionally, the transconductance gm of a transistor.

In addition, specifically, the transistor connected as a diode cancels out the current-based conflict between the P and N transistors of the conventional devices in the transient state.

Additionally, the PMOS transistors connected as diodes P12, P22 may also have "W/L" size ratios leading to conductances of the same order as the others, for example to within 50%.

FIG. 2 illustrates an example of a first alternative for positioning the PMOS transistors connected as diodes P12, P22 in the latch circuit. In this alternative, each PMOS transistor connected as a diode, on its respective branch, is coupled in series between the supply terminal VCC of the latch and the cross-coupled PMOS transistor P11, P12 of the latch.

Figure 6:
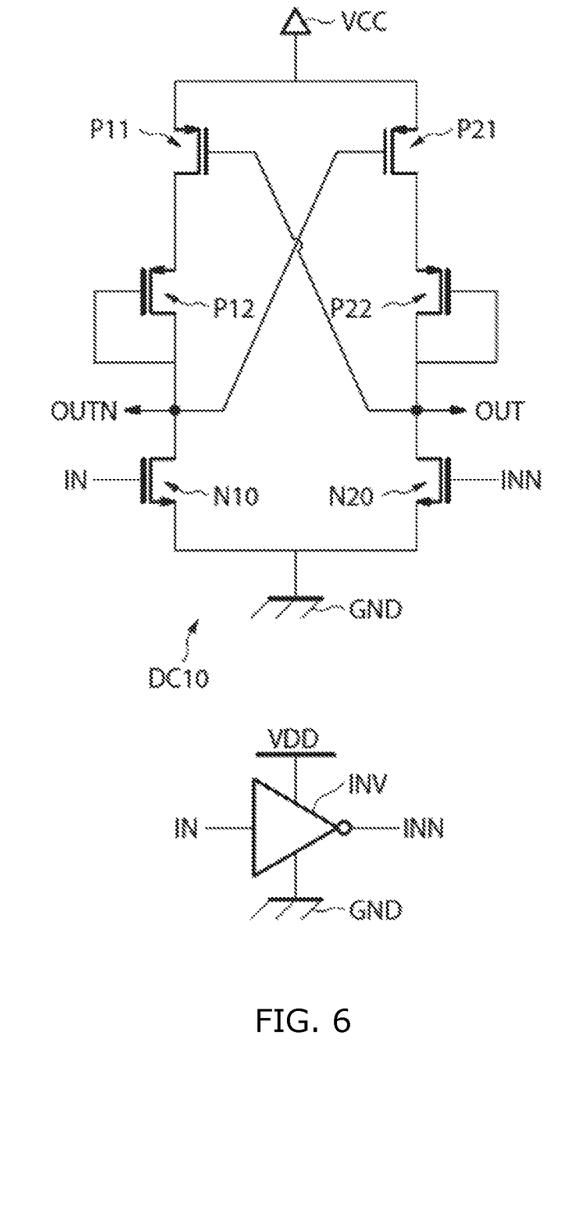
FIG. 6 illustrates an example of an alternative embodiment voltage level shifter.

FIG. 6 illustrates an example of a second alternative of the voltage level shifter DC10. In this second alternative, each PMOS transistor connected as a diode, on its respective branch, is coupled in series between the output OUT, OUTN and the cross-coupled PMOS transistor P11, P12.

Figure 3:
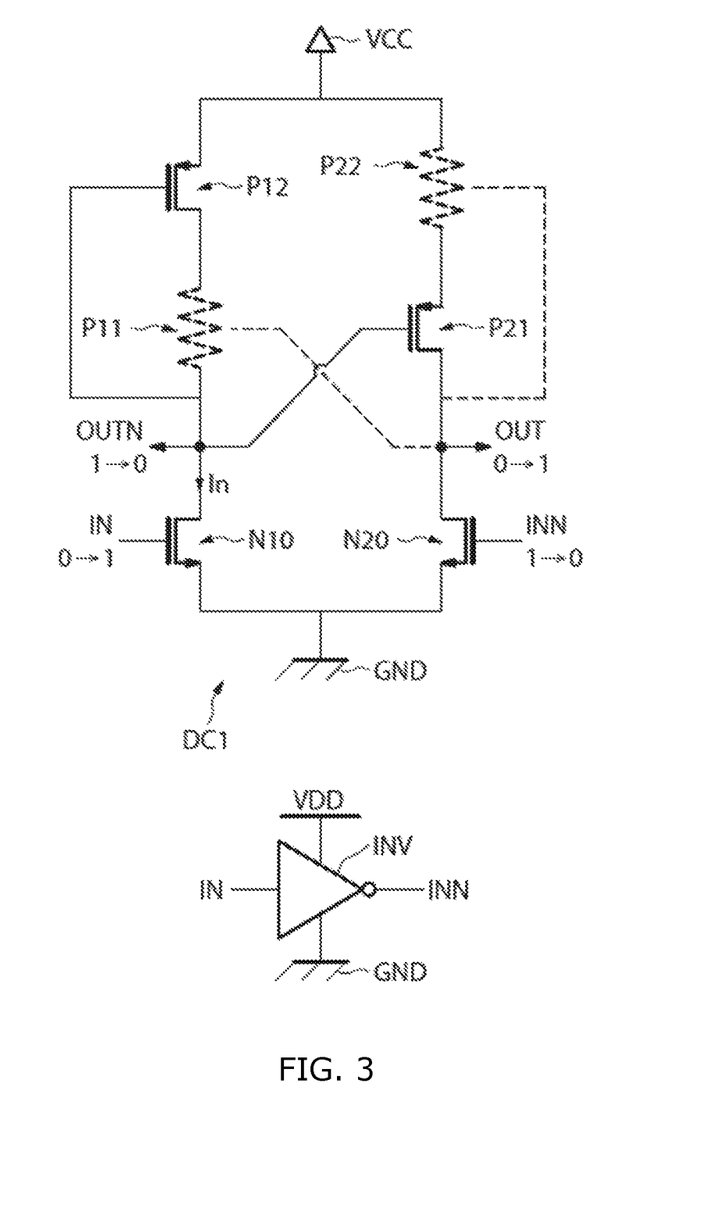
FIG. 3 illustrates an operation of the device of FIG. 2.

Reference is now once again made to FIG. 2 and to FIG. 3.

FIG. 3 illustrates a transition of an on input level from 0 to 1, in the alternative of the shifter DC1 described above with reference to FIG. 2.

Of course, on the inputs IN, INN, "0" denotes the low level GND of the input voltage and "1" denotes the high level VDD of the input voltage, while on the outputs OUT, OUTN, "0" also denotes the low level GND and "1" denotes the high level of the shifted voltage, which is close to VCC and higher than the high input level VDD.

During the transition, the transistor N10 controlled by IN turns on and draws a current In over the inverting output OUTN, which tends to lower the voltage of the inverting output OUTN.

Since the latch circuit was previously latched onto the state 0 (0 on the follower output OUT), the transistor P11 controlled by OUT is also on. At this stage, in conventional structures, a current-based conflict occurs between the P-type transistor and the N-type transistor.

However, the transistor connected as a diode P12 on the branch of the inverting output OUTN is coupled in series on the branch, and forms a buffer for the latch supply VCC.

The transistor N10 of the input stage draws its current In distributed by the transistor connected as a diode P12, and the gate voltage of the latter is transmitted to the cross-coupled transistor P21 of the other branch (via the output node OUTN). By means of current mirroring, the transistor P21 channels the current In towards the follower output OUT.

Specifically, since the latch was previously latched onto the state 0 on the follower output OUT, the transistor connected as a diode of this branch P22, being coupled to OUT, is initially on and channels the current copied by P21.

Therefore, via the overall channeling of the currents through the cross-coupled PMOS transistors, the latch is stabilized at a level of "1" on the follower output OUT and of "0" on the inverting output OUTN.

The transition from 1 to 0 at input IN is symmetrically identical due to the effect of the inverted input signal INN on the NMOS transistor N20 coupled to the follower output OUT.

As such, the level "1" voltage on the output is intended to be at the level of the supply voltage of the latch VCC.

However, here the supply voltage VCC is communicated to the follower output OUT via a diode P22. Thus, the actual level of the voltage at output OUT is close to VCC-Vth, where Vth is the threshold voltage of the transistor connected as a diode P22.

This may not present any problem if the output OUT is intended for supplying power to a device including for example an amplifier buffer stage at input, or a Schmitt trigger.

However, this does present a problem if the output OUT is intended for supplying power to a device with substantial constraints in terms of current leakages.

Figure 4:
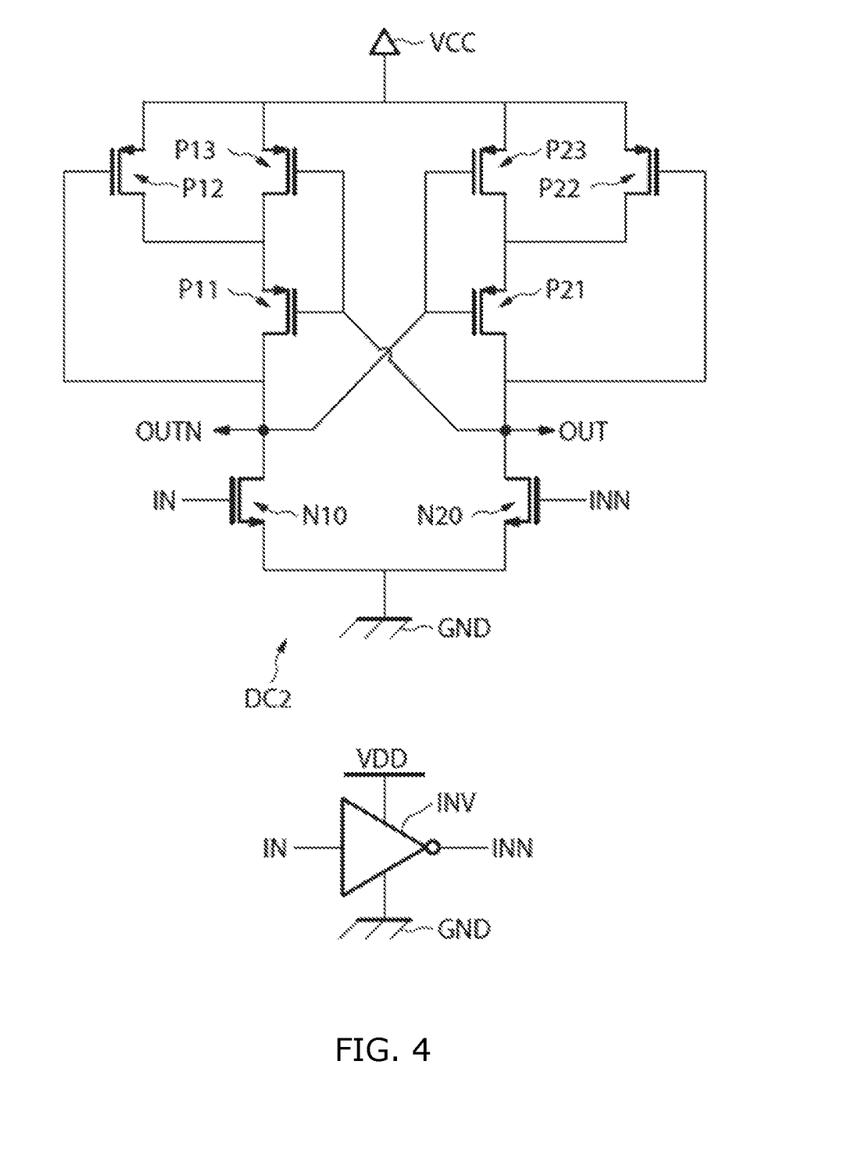
FIG. 4 shows an embodiment of the voltage level shifter.

FIG. 4 shows one embodiment of the voltage level shifter DC2 making it possible to achieve the totality of the latch supply voltage VCC at output OUT, OUTN.

In this embodiment, the latch circuit further includes, on each branch, a low-conductance PMOS transistor P13, P23 that is coupled in parallel with each PMOS transistor connected as a diode P12, P22.

The transistors P13, P23 are referred to as "low-conductance" transistors because they are configured to have a conductance that is lower than the conductance of the NMOS transistors of the input stage N10, N20. The value of the conductance is in particular configured by designing the PMOS transistors P13, P23 with a "W/L" size ratio that is much lower than the "W/L" size ratio of the other transistors of the voltage level shifter, introducing a transconductance gm that is also much lower.

In particular, the conductance of the low-conductance transistors P13, P23 is less than 50% of that of the NMOS transistors of the input stage N10, N20.

Since the transistors connected as diodes P12 and P22 are each in series with the cross-coupled transistor P11, P21 of the respective branch, each low-conductance PMOS transistor P13, P23 is coupled in series with the cross-coupled transistor P11, P21 of each respective branch.

The gate of each low-conductance transistor P13, P23 is coupled with the gate of the cross-coupled PMOS transistor P11, P21 of the respective branch. Thus, the low-conductance transistors operate in the same way as the cross-coupled transistors in the latch and, in the latched state, short the respective transistor connected as a diode P12, P22 so as to transmit the totality of the supply voltage VCC over the output OUT, OUTN.

However, given the difference in size ratios, the low-conductance transistors P13, P23 are slower to be switched on and do not interfere with the transition effect described above with reference to FIG. 3.

In particular, the increase in transition speed is still present in this embodiment, even after complete stabilization of the latch on the totality of the supply voltage VCC.

Figure 5:
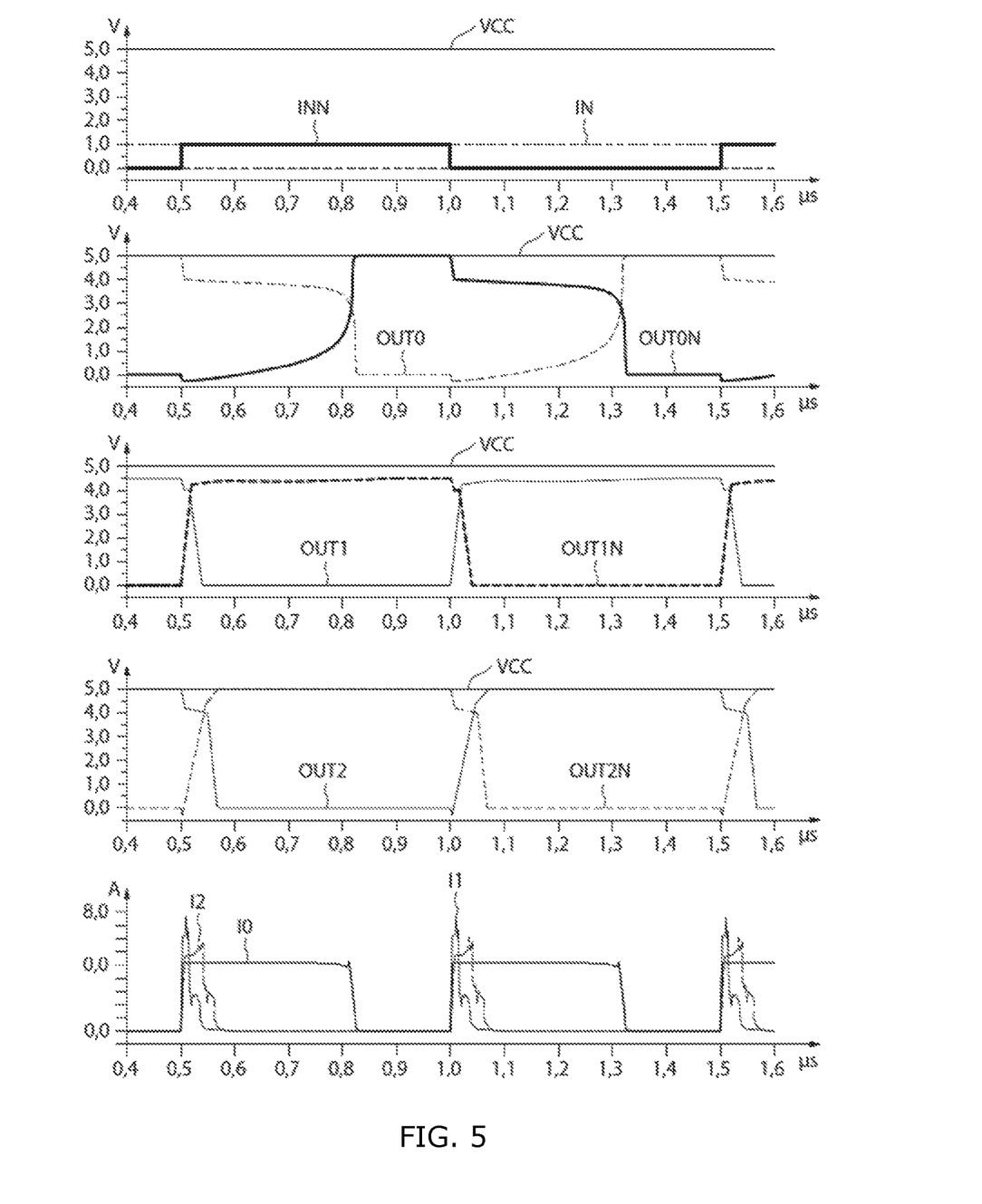
FIG. 5 illustrates examples of temporal responses in terms of voltage and in terms of current for the various embodiments.

FIG. 5 illustrates examples of temporal responses in terms of voltage and in terms of current to input commands IN, INN for the various embodiments described above with reference to FIGS. 2 to 4 and, by way of comparison, for a conventional voltage level shifter such as introduced above with reference to FIG. 1, all of the transistors being sized to deliver similar currents with the given biases.

The curves OUTo, OUToN represent the voltages from the complementary outputs of the conventional shifter.

The switching time of the conventional shifter is, in this example, substantially 300 ns.

The curve Io represents the current consumed in the conventional shifter and is substantially 10 µA for the entire switching time of the conventional shifter.

The curves OUT, OUTN represent the voltages of the complementary outputs of the embodiment DC1 described with reference to FIG. 2 or the embodiment DC10 described with reference to FIG. 6.

The switching time of the shifter embodiment DC1 or DC10 is around 25 ns, and the maximum value at substantially 4.5 V, i.e. the 5 V of VCC without the threshold voltage Vth of the PMOS transistor connected as a diode.

The curve I1 represents the current consumed in the shifter DC1 or DC10 and follows a pulse of between 10 μA and 15 pA for the 25 ns switching time.

The curves OUT, OUTN represent the voltages of the complementary outputs of the embodiment DC2 described with reference to FIG. 4.

The switching time of the shifter embodiment DC2 is around 50 ns, and the maximum value at 5 V, i.e. the high-level supply voltage VCC of the latch.

The curve 12 represents the current consumed in the shifter DC2 and follows a pulse of between 10 μA and 15 μA for the 50 ns switching time.

Figure 7:
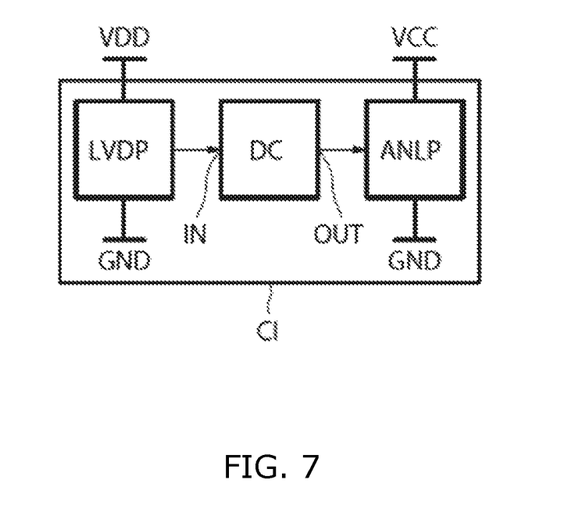
FIG. 7 shows an integrated circuit according to embodiments of the invention.

FIG. 7 shows an integrated circuit CI including a digital portion LVDP that is intended to be supplied with power at a first voltage level VDD and an analog portion ANLP that is intended to be supplied with power at a second voltage level VCC, which is higher than the first level VDD. The digital LVDP and analog ANLP portions may receive one and the same reference voltage GND, for example the ground of the integrated circuit CI.

The digital portion LVDP is configured to generate commands at the first voltage level VDD for controlling the analog portion ANLP. However, the analog portion is designed to receive commands at the second voltage level VCC.

The voltage level shifter device DC thus allows the first voltage level of the commands from the digital portion LVDP to be shifted to the second voltage level VCC for the analog portion ANLP.

What is claimed is:

1. A voltage level shifter device comprising:
   an input stage configured to receive an input voltage to be shifted, the input voltage having a high level or a low level;
   first and second output terminals, wherein the input stage is configured to lower one of the first and second output terminals to the low level according to the level of the input voltage; and
   a latch circuit comprising:
   a first branch having a first PMOS transistor and a second PMOS transistor coupled in series coupled between a shifted-high-level voltage supply terminal and the first output terminal and a second branch having a third PMOS transistor an a fourth PMOS transistor coupled in series between the shifted-high-level voltage supply terminal and the second output terminal,
   a fifth PMOS transistor coupled in parallel with the second PMOS transistor and having a gate coupled to the second output terminal, wherein the fifth PMOS transistor has conduction terminals directly connected to conduction terminals of the second PMOS transistor, and
   a sixth PMOS transistor coupled in parallel with the fourth PMOS transistor and having a gate coupled to the first output terminal, wherein the sixth PMOS transistor has conduction terminals directly connected to conduction terminals of the fourth PMOS transistor;
   wherein the first output terminal is coupled to a conduction terminal of the first PMOS transistor, to a gate of the second PMOS transistor, and to a gate of the third PMOS transistor; and
   wherein the second output terminal is coupled to a conduction terminal of the third PMOS transistor, to a gate of the fourth PMOS transistor, and to a gate of the first PMOS transistor.

2. The device according to claim 1, wherein the input stage comprises a first NMOS transistor coupled between a low-level-voltage supply terminal and the first output terminal.

3. The device according to claim 2, wherein the input stage further comprises a second NMOS transistor coupled between the low-level-voltage supply terminal and the second output terminal, wherein the first NMOS transistor and the second NMOS transistor are controllable by the input voltage and an inverted input voltage, respectively, the inverted input voltage having the high level when the input voltage has the low level and the inverted input voltage having the low level when the input voltage has the high level.

4. The device according to claim 3, wherein conductances of the first NMOS transistor, the second NMOS transistor, the first PMOS transistor, the second PMOS transistor, the third PMOS transistor and the fourth PMOS transistor are equal to within 50%.

5. The device according to claim 4, wherein the fifth and sixth PMOS transistor each have a conductance that is less than 50% of the conductance of the first NMOS transistor and the second NMOS transistor.

6. The device according to claim 1, wherein the second PMOS transistor is coupled in series between the shifted-high-level voltage supply terminal and the first PMOS transistor and wherein the fourth PMOS transistor is coupled in series between the shifted-high-level voltage supply terminal and the third PMOS transistor.

7. The device according to claim 1, wherein the voltage level shifter device is incorporated within an integrated circuit.

8. An integrated circuit comprising:
   a digital portion that is intended to be supplied with power at a first voltage level;
   an analog portion that is intended to be supplied with power at a second voltage level that is higher than the first voltage level, the digital portion being configured to generate commands at the first voltage level for controlling the analog portion;
   a voltage level shifter device being configured to shift the first voltage level of the commands from the digital portion to the second voltage level for the analog portion, wherein the voltage level shifter device comprises:
   an input stage coupled to the digital portion;
   first and second output terminals coupled to the analog portion; and
   a latch circuit comprising:
   a first branch having a first PMOS transistor and a second PMOS transistor coupled in series coupled between a shifted-high-level voltage supply terminal and the first output terminal and a second branch having a third PMOS transistor an a fourth PMOS transistor coupled in series between the shifted-high-level voltage supply terminal and the second output terminal, a fifth PMOS transistor coupled in parallel with the second PMOS transistor and having a gate coupled to the second output terminal, and a sixth PMOS transistor coupled in parallel with the fourth PMOS transistor and having a gate coupled to the first output terminal;

wherein the first output terminal is coupled to a conduction terminal of the first PMOS transistor and to a gate of the third PMOS transistor, and is directly connected to a gate of the second PMOS transistor; and wherein the second output terminal is coupled to a conduction terminal of the third PMOS transistor and to a gate of the first PMOS transistor, and is directly connected to a gate of the fourth PMOS transistor.

9. The integrated circuit according to claim 8, wherein the input stage comprise:

a first NMOS transistor coupled between a low-level-voltage supply terminal and the first output terminal; and a second NMOS transistor coupled between the low-level-voltage supply terminal and the second output terminal, wherein conductances of the first NMOS transistor, the second NMOS transistor, the first PMOS transistor, the second PMOS transistor, the third PMOS transistor and the fourth PMOS transistor are equal to within 50%.

10. The integrated circuit according to claim 9, wherein the fifth and sixth PMOS transistor each have a conductance that is less than 50% of the conductance of the first NMOS transistor and the second NMOS transistor.

11. The integrated circuit according to claim 9, wherein a first conduction terminal of the first NMOS transistor is directly connected to a first conduction terminal of the first PMOS transistor.

12. The integrated circuit according to claim 8, wherein a current path of the first PMOS transistor is configured to carry all current flowing through a current path of the second PMOS transistor.

13. The integrated circuit according to claim 8, wherein a first conduction terminal of the first PMOS transistor is directly connected to a first conduction terminal of the second PMOS transistor.

14. The integrated circuit according to claim 13, wherein a first conduction terminal of the fifth PMOS transistor is directly connected the first conduction terminals of the first and second PMOS transistors.

15. A circuit comprising:

a first voltage supply node configured to supply a first voltage level;

a second voltage supply node, the second voltage supply node configured to supply a second voltage level that is higher than the first voltage level;

a reference voltage node configured to supply a reference voltage level;

a first NMOS transistor coupled between the reference voltage node and a first terminal;

a second NMOS transistor coupled between the reference voltage node and a second terminal;

an inverter having an input coupled to a gate of the first NMOS transistor and an output coupled to the gate of the second NMOS transistor, the inverter coupled between the first voltage supply node and the reference voltage node;

a first PMOS transistor coupled between the second voltage supply node and the first terminal;

a second PMOS transistor coupled in series with the first PMOS transistor between the second voltage supply node and the first terminal;

a third PMOS transistor coupled between the second voltage supply node and the second terminal; and a fourth PMOS transistor coupled in series with the third PMOS transistor between the second voltage supply node and the second terminal;

a fifth PMOS transistor coupled in parallel with the second PMOS transistor and having a gate coupled to the second terminal;

a sixth PMOS transistor coupled in parallel with the fourth PMOS transistor and having a gate coupled to the first terminal wherein the first terminal is directly connected to a gate of the second PMOS transistor and is coupled to a gate of the third PMOS transistor; and wherein the second terminal is coupled to a gate of the fourth PMOS transistor and is directly connected to a gate the first PMOS transistor.

16. The circuit according to claim 15, wherein the circuit operates as a voltage level shifter and wherein the first and second terminals are first and second output terminals, the voltage level shifter being configured to shift a first digital signal that has values corresponding to either the first voltage level or the reference voltage level to a second digital signal that has values corresponding to either the second voltage level or the reference voltage level.

17. The circuit according to claim 16, further comprising: digital circuitry coupled to the input of the inverter; and analog circuitry coupled to the first and second output terminals.

18. The circuit according to claim 15, wherein conductances of the first NMOS transistor, the second NMOS transistor, the first PMOS transistor, the second PMOS transistor, the third PMOS transistor and the fourth PMOS transistor are equal to within 50%.

19. The circuit according to claim 18, wherein the fifth and sixth PMOS transistor each have a conductance that is less than 50% of the conductance of the first NMOS transistor and the second NMOS transistor.

20. The circuit according to claim 15, wherein the second PMOS transistor is coupled in series between the second voltage supply node and the first PMOS transistor and wherein the fourth PMOS transistor is coupled in series between the second voltage supply node and the third PMOS transistor.

21. The circuit according to claim 15, wherein the circuit is incorporated within an integrated circuit.

* * * * *